United States Patent [19]

Pearlman

[11] 3,924,199

[45] Dec. 2, 1975

[54] N-POLE FILTER CIRCUIT HAVING CASCADED FILTER SECTIONS

[75] Inventor: Alan R. Pearlman, Newton Highlands, Mass.

[73] Assignee: ARP Instruments, Inc., Newton, Mass.

[22] Filed: Feb. 4, 1974

[21] Appl. No.: 439,353

[52] U.S. Cl. .................................. 330/107; 328/167

[51] Int. Cl.$^2$ ........................................... H03F 1/36

[58] Field of Search ............. 330/21, 31, 107, 30 D, 330/109; 328/167

[56] References Cited

UNITED STATES PATENTS

| | | | |
|---|---|---|---|
| 3,528,040 | 9/1970 | Galvin | 330/109 X |
| 3,531,730 | 9/1970 | Steckler | 330/30 D UX |
| 3,805,091 | 4/1974 | Colin | 328/167 X |

OTHER PUBLICATIONS

Electronic Engineering, "Multiplier as a Variable Resistor Voltage–Controlled Active Filter," Oct. 1972, p. 27.

*Primary Examiner*—James B. Mullins

[57] ABSTRACT

The n-pole filter preferably has four filter circuits cascaded in series. Each of the filter circuits is preferably a low-pass filter circuit and each has a controllable frequency response which is variably controlled from a common current or voltage source. Each filter circuit includes a transconductance circuit and inverting operational amplifier. A feedback resistor couples between the first and last filter circuits and is adjustable to provide different amounts of resonance.

5 Claims, 5 Drawing Figures

N-POLE FILTER CIRCUIT HAVING CASCADED FILTER SECTIONS

BACKGROUND OF THE INVENTION

The present invention pertains in general to filter circuits. More particularly, the present invention relates to an n-pole filter circuit which is preferably a low-pass filter with a variable and controllable frequency response.

Accordingly, one important object of the present invention is to provide an improved n-pole filter, and of the type having means for receiving a controlled signal for controlling the frequency response of the filter circuit. The filter circuit of the present invention is preferably for use in an electronic musical instrument for controlling audio signals.

Another object of the present invention is to provide preferably a four pole low-pass filter wherein each stage of the filter provides approximately 45° phase shift between DC and the cutoff frequency.

Another object of the present invention is to provide a filter in accordance with the preceding object and that has means for providing variable and controllable resonance in the region of the cutoff frequency.

SUMMARY OF THE INVENTION

To accomplish the foregoing and other objects of the invention, the n-pole filter generally comprises a plurality of filter circuits cascaded in series, each filter circuit including a transconductance means, an integrating amplifier and a feedback means. The filter also includes a current source having a plurality of output lines coupling respectively to the tranconductance means of each filter circuit for controlling in concert the transconductance of each transconductance means. A variable and controllable signal is provided for controlling the common current source. In a preferred embodiment a feedback resonance circuit is also provided preferably in the form of a potentiometer coupling between the last filter circuit and the first filter circuit. This potentiometer is adjustable to provide different amounts of resonance.

DESCRIPTION OF THE DRAWINGS

Numerous other objects, features and advantages of the invention will now become apparent upon a reading of the following detailed description taken in conjunction with the accompanying drawings in which.

DETAILED DESCRIPTION

Figure 1:
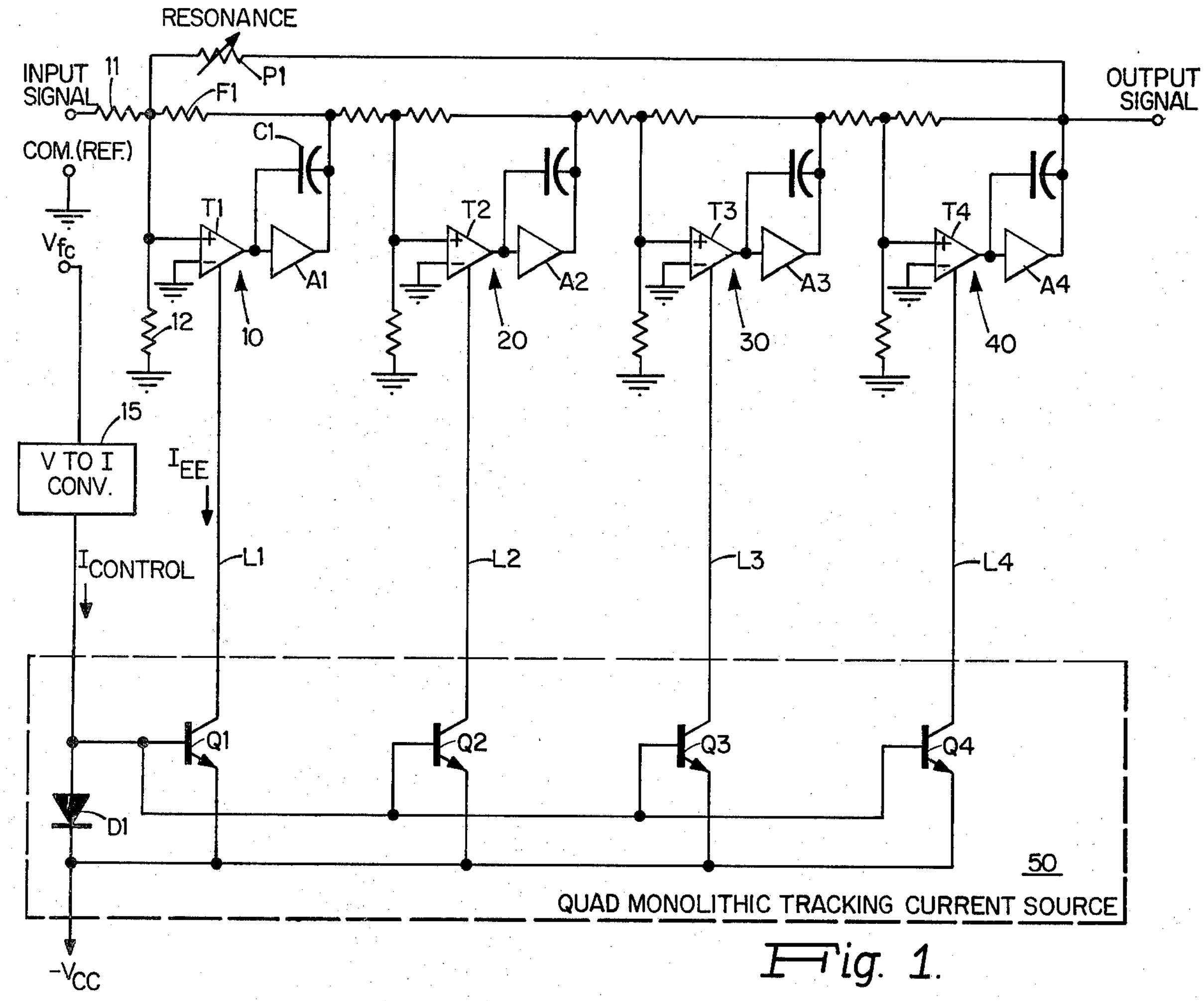
FIG. 1 is an illustrative embodiment of an n-pole filter constructed in accordance with the principles of the present invention.

FIG. 1 shows one embodiment for a four pole current-controlled low-pass filter of this invention. The filter circuit of FIG. 1 comprises individual filter stages 10, 20, 30 and 40, and common current source 50. Each of the filter stages is a low-pass configuration and of the type disclosed in co-pending application Ser. No. 263,177, now Pat. No. 3,805,091, filed on June 15, 1972 and assigned to the assignee of the present invention.

Filter circuit 10, for example, includes operational transconductance amplifier T1 and inverting operational amplifier A1. Similarly, circuits 20, 30 and 40 include respectively transconductance amplifiers T2, T3 and T4; and operational amplifiers A2, A3 and A4.

As each of the filter circuits is of substantially the same construction only filter circuit 10 is discussed in detail.

Filter 10 includes an input resistor 11 to which an input signal is coupled. This signal is coupled by way of resistor 11 to one input of operational transconductance amplifier T1. A second resistor 12 is tied from the input of amplifier 10 to ground. Amplifier A1 has a capacitor C1 coupled thereacross and there is also provided a feedback resistor F1 coupling from the output of amplifier A1 back to the input of amplifier T1.

Figure 2:
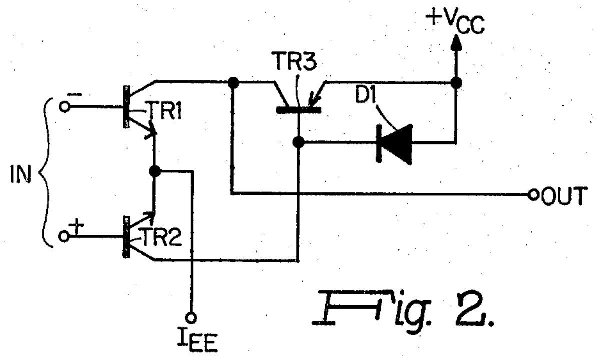
FIG. 2 is one possible circuit implementation for the transconductance means shown in FIG. 1.

Each of the transconductance amplifiers may be of the type depicted in the circuit configuration of FIG. 2. The transconductance amplifier includes an input transistor pair including transistors TR1 and TR2 which have their emitters tied in common to a current control input terminal. The circuit of FIG. 2 also includes a third transistor TR3 which comprises with diode D1 a current reflector circuit similar to the one taught in co-pending application Ser. No. 263,177.

For the filter circuit 10 the voltage transfer function can be shown to be:

$$\frac{V_o}{V_i} = \frac{-G_m A}{sC + G_m A}$$

It can be shown that the cutoff frequency for each filter section is a function of the capacitor C1, with regard to filter circuit 10, and the control current Iee provided from current source 50.

The other filter circuits connect to filter circuit 10 and together provide a high frequency roll-off of 24db per octave. FIG. 3B shows the plot of frequency versus gain with the abrupt roll-off provided by the four filter circuits.

As previously mentioned the cut-off frequency is determined parimarily by the control current to the transconductance amplifier of each circuit which is provided on the four lines L1, L2, L3 and L4 each of which connect respectively from the collectors of transistors Q1, Q2, Q3 and Q4.

In order to provide the control there is a variable input voltage signal which is coupled to converter 15 which is a voltage to current converter. The output of converter 15 couples in parallel to the bases of transistors Q1–Q4. These transistors are preferably matched and part of a monolithic integrated circuit array containing diode D1. The combination of any one of the transistors and diode D1 constitutes a "current-mirror", which is well-known in the state of the art of integrated circuit design. Hence, any transistor's collector current is essentially proportional to the current through the diode D1, and the collector current of each of transistors Q1, Q2, Q3 and Q4 are equal to each other if the transistors have the same geometry and are on the same silicon chip.

Figure 3A:
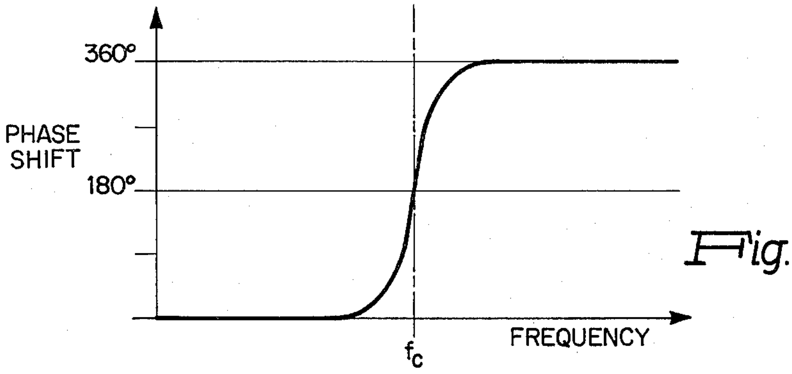
FIG. 3A is a waveform associated with the circuit of FIG. 1 plotting frequency versus phase shift.
Figure 3B:
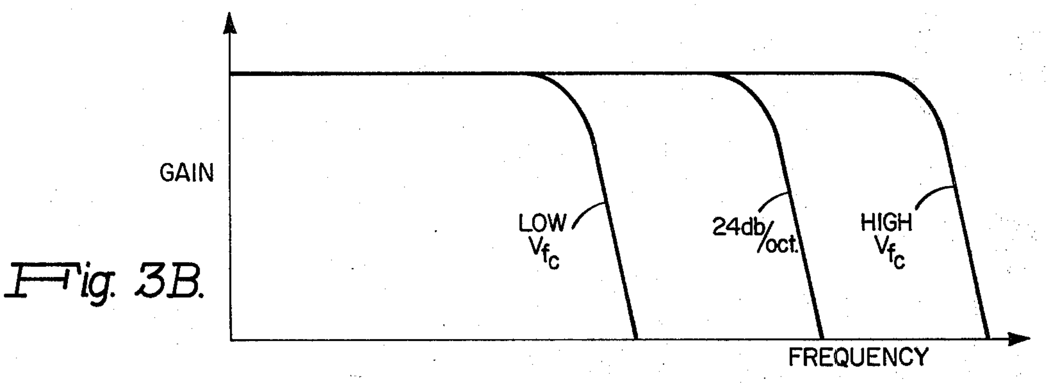
FIG. 3B is another waveform associated with the circuit of FIG. 1 and plotting frequency versus gain.
Figure 3C:
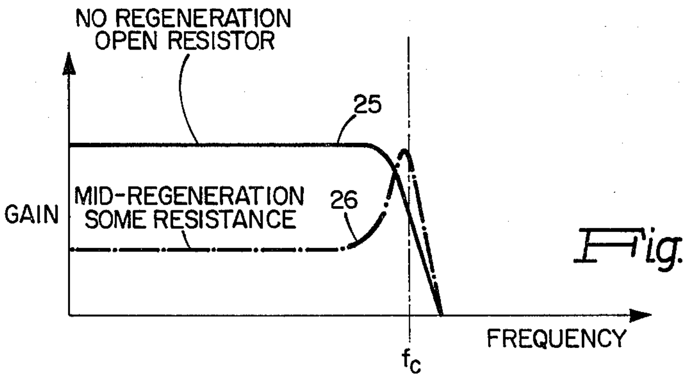
FIG. 3C is still another waveform that may be associated with the circuit of FIG. 1 and plotting frequency versus gain under conditions of resonance and no resonance.

By employing preferably four filter circuits as depicted in FIG. 1, and as can be seen from the plot of FIG. 3A, there is 180° phase shift between low frequency and the cut-off frequency. The circuit of FIG. 1 also provides a feedback potentiometer P1 for providing controllable amounts of resonance. Thus, by feeding back part of the output signal to the input filter circuit resonance occurs about the cut-off frequency wherein the phase shift approaches 180°. This phenomenon is shown most clearly in FIG. 3C. In FIG. 3C the curve 25 represents a plot of frequency versus gain with no regeneration whereas the curve 26 represents a mid setting of potentiometer P1 to provide some regeneration. The curve 25 was taken with the resistor open and the curve 26 with the resistor at some mid setting.

The circuit of this invention is preferably for use in an electronic musical instrument and this invention provides a relatively simple way of providing easily controllable resonance in such a circuit. Furthermore, this invention provides for common control of the filter sections to provide a variable cut-off frequency which is also desirable for electronic musical instrument applications.

Having described one circuit implementation of the present invention, it should now be apparent to those skilled in the art that numerous other configurations are contemplated as falling within the spirit and scope of the present invention. For example, in FIG. 2 is shown one particular transconductance amplifier. However, it should be obvious that various other configurations can be incorporated in the circuit of this invention. Also, there has been shown one particular type of multi-output current source. There are available many different types of current sources that could be used in its place. The invention should be limited solely by the appended claims.

What is claimed is:

1. An active low-pass filter having a selectable cutoff frequency and providing a controllable resonance peak in the vicinity thereof, comprising A. n low-pass series-connected filter sections, each having an input and an output and characterized by a cutoff frequency selected by a control current applied thereto, each contributing a phrase shaft of $180/n$ degrees at resonance, B. a current source responsive to control input applied thereto to provide a substantially identical control current to each filter section for selecting the cutoff frequency thereof, in accordance with said control input, and C. a resistor interconnecting the output of a last of said filter with the input of a first thereof and adjustable to vary the resonance peak of the filter.

2. A filter according to claim 1 in which $n$ equals 4.

3. A filter according to claim 2 which includes a plurality of resistors interconnecting corresponding pairs of filter sections.

4. A filter according to claim 2 in which each filter section comprises an integrator and a variable conductance means forming a part thereof.

5. A filter according to claim 2 which includes a voltage to current converter for converting a control voltage to a corresponding current for supplying the control input to said current source.

* * * * *